United States Patent
Briggs et al.

(10) Patent No.: US 10,515,894 B2
(45) Date of Patent: Dec. 24, 2019

(54) ENHANCED SELF-ALIGNMENT OF VIAS FOR A SEMICONDUCTOR DEVICE

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, Saratoga Springs, NY (US); Bartlet H. DeProspo, Goshen, NY (US); Michael Rizzolo, Albany, NY (US); Nicole A. Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/966,236

(22) Filed: Apr. 30, 2018

(65) Prior Publication Data

US 2018/0254242 A1    Sep. 6, 2018

Related U.S. Application Data

(62) Division of application No. 15/198,962, filed on Jun. 30, 2016, now Pat. No. 10,211,151.

(51) Int. Cl.
*H01L 23/528* (2006.01)
*H01L 23/522* (2006.01)
(Continued)

(52) U.S. Cl.
CPC ........ *H01L 23/528* (2013.01); *H01L 21/7684* (2013.01); *H01L 21/76811* (2013.01);
(Continued)

(58) Field of Classification Search
CPC ............ H01L 23/528; H01L 23/53228; H01L 23/5226; H01L 21/7684; H01L 21/76877; H01L 21/76816
See application file for complete search history.

(56) References Cited

U.S. PATENT DOCUMENTS

| | | | | |
|---|---|---|---|---|
| 6,020,255 A | * | 2/2000 | Tsai | H01L 21/76807 257/E21.579 |
| 6,083,824 A | * | 7/2000 | Tsai | H01L 21/31144 257/E21.257 |

(Continued)

FOREIGN PATENT DOCUMENTS

KR    20090070684 A  *  7/2009

OTHER PUBLICATIONS

List of IBM Patents or Patent Applications Treated As Related; (Appendix P), Filed Apr. 30, 2018; pp. 1-2.

*Primary Examiner* — Earl N Taylor
(74) *Attorney, Agent, or Firm* — Cantor Colburn LLP; Vazken Alexanian

(57) ABSTRACT

A method of forming a self-aligned pattern of vias in a semiconductor device comprises etching a pattern of lines that contain notches that are narrower than other parts of the line. Thereafter, vias are created where the notches are located. The locations of the vias are such that the effect of blown-out areas is minimized. Thereafter, the lines are etched and the vias and line areas are filled. The layers are planarized such that the metal fill is level with a surrounding ultra-low-k dielectric. Additional metal layers, lines, and vias can be created. Other embodiments are also described herein.

6 Claims, 8 Drawing Sheets

(51) Int. Cl.
*H01L 21/768* (2006.01)
*H01L 23/532* (2006.01)

(52) U.S. Cl.
CPC .. *H01L 21/76816* (2013.01); *H01L 21/76877* (2013.01); *H01L 23/5226* (2013.01); *H01L 23/53228* (2013.01)

(56) References Cited

U.S. PATENT DOCUMENTS

| | | | | |
|---|---|---|---|---|
| 6,261,960 B1* | 7/2001 | Yu | | H01L 21/76802 216/38 |
| 6,323,118 B1* | 11/2001 | Shih | | H01L 21/31116 257/E21.252 |
| 6,345,399 B1* | 2/2002 | Jamison | | H01L 21/0332 204/192.35 |
| 6,689,695 B1* | 2/2004 | Lui | | H01L 21/0271 257/E21.024 |
| 6,764,795 B2* | 7/2004 | Aton | | G03F 1/36 430/5 |
| 6,780,761 B1* | 8/2004 | Wu | | H01L 21/76826 257/E21.579 |
| 7,033,929 B1* | 4/2006 | Burke | | H01L 21/76808 257/E21.577 |
| 7,115,343 B2* | 10/2006 | Gordon | | G03F 1/36 430/5 |
| 7,238,619 B2* | 7/2007 | Zhou | | H01L 21/31144 257/E21.257 |
| 7,424,699 B2* | 9/2008 | O'Brien | | G03F 7/70441 430/5 |
| 7,451,428 B2* | 11/2008 | O'Brien | | G03F 1/36 716/50 |
| 7,694,269 B2* | 4/2010 | Savithri | | G03F 1/36 716/50 |
| 7,999,392 B2* | 8/2011 | Ohtake | | H01L 21/76808 174/261 |
| 8,058,177 B2* | 11/2011 | Weiss | | H01L 21/76816 257/396 |
| 8,143,138 B2* | 3/2012 | Patz | | H01L 21/67253 257/E21.021 |
| 8,143,159 B2* | 3/2012 | King | | H01L 21/76807 438/672 |
| 8,247,846 B2* | 8/2012 | Becker | | G06F 17/5068 257/211 |
| 8,668,835 B1* | 3/2014 | Indrakanti | | H01L 21/31116 216/17 |
| 8,748,066 B2* | 6/2014 | Chen | | G03F 1/00 430/5 |
| 8,895,445 B2* | 11/2014 | Hsieh | | H01L 21/31116 257/E21.249 |
| 8,906,810 B2* | 12/2014 | Indrakanti | | H01L 21/76811 438/715 |
| 8,916,472 B2* | 12/2014 | Hu | | H01L 21/76811 438/428 |
| 8,977,988 B2* | 3/2015 | Fang | | G06F 17/5077 382/144 |
| 9,245,792 B2* | 1/2016 | Chen | | H01L 21/02134 |
| 9,293,413 B2* | 3/2016 | Yao | | H01L 21/76802 |
| 9,330,974 B2* | 5/2016 | Kim | | H01L 21/76804 |
| 9,355,893 B1* | 5/2016 | Chen | | H01L 21/76808 |
| 9,391,020 B2* | 7/2016 | Zhang | | H01L 21/7681 |
| 9,659,820 B2* | 5/2017 | Zhang | | H01L 21/7681 |
| 9,761,486 B2* | 9/2017 | Kuo | | H01L 23/49822 |
| 2003/0199169 A1* | 10/2003 | Jun | | H01L 21/76807 438/694 |
| 2004/0127016 A1* | 7/2004 | Hoog | | H01L 21/76801 438/637 |
| 2005/0090117 A1* | 4/2005 | Lee | | H01L 21/31116 438/706 |
| 2006/0189150 A1* | 8/2006 | Jung | | G03F 7/0387 438/758 |
| 2007/0010092 A1* | 1/2007 | Zhou | | H01L 21/31144 438/638 |
| 2008/0093743 A1* | 4/2008 | Yang | | B81C 1/00095 257/758 |
| 2008/0242098 A1* | 10/2008 | Nam | | H01L 21/32135 438/703 |
| 2009/0130819 A1* | 5/2009 | Shim | | H01L 21/3081 438/424 |
| 2009/0278173 A1* | 11/2009 | Fang | | H01L 27/115 257/211 |
| 2014/0038412 A1* | 2/2014 | Hu | | H01L 21/76811 438/689 |
| 2014/0304666 A1* | 10/2014 | Fang | | G06F 17/5077 716/53 |
| 2015/0279780 A1* | 10/2015 | Zhang | | H01L 21/7681 257/774 |
| 2015/0279784 A1* | 10/2015 | Zhang | | H01L 21/76808 257/750 |
| 2015/0379188 A1* | 12/2015 | Kahng | | G06F 17/5081 716/53 |
| 2017/0018458 A1* | 1/2017 | Cheng | | H01L 21/76883 |
| 2018/0005937 A1* | 1/2018 | Briggs | | H01L 23/528 |
| 2018/0254242 A1* | 9/2018 | Briggs | | H01L 23/528 |

* cited by examiner

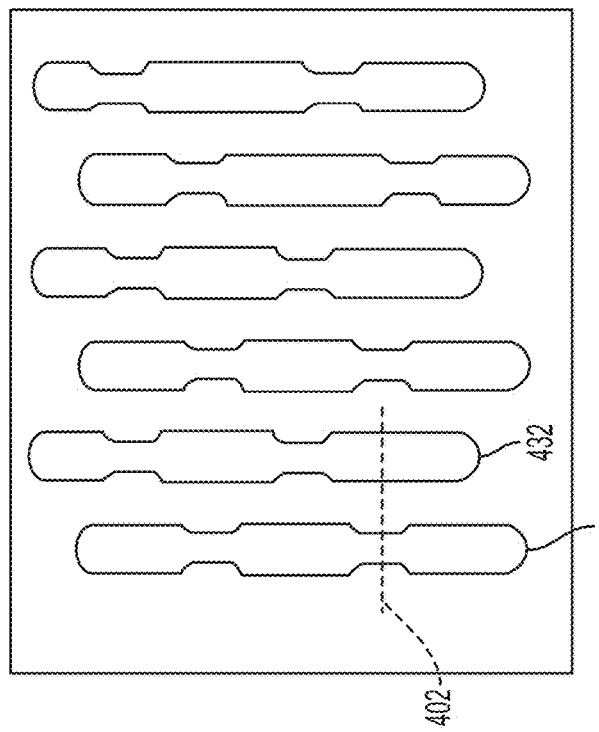
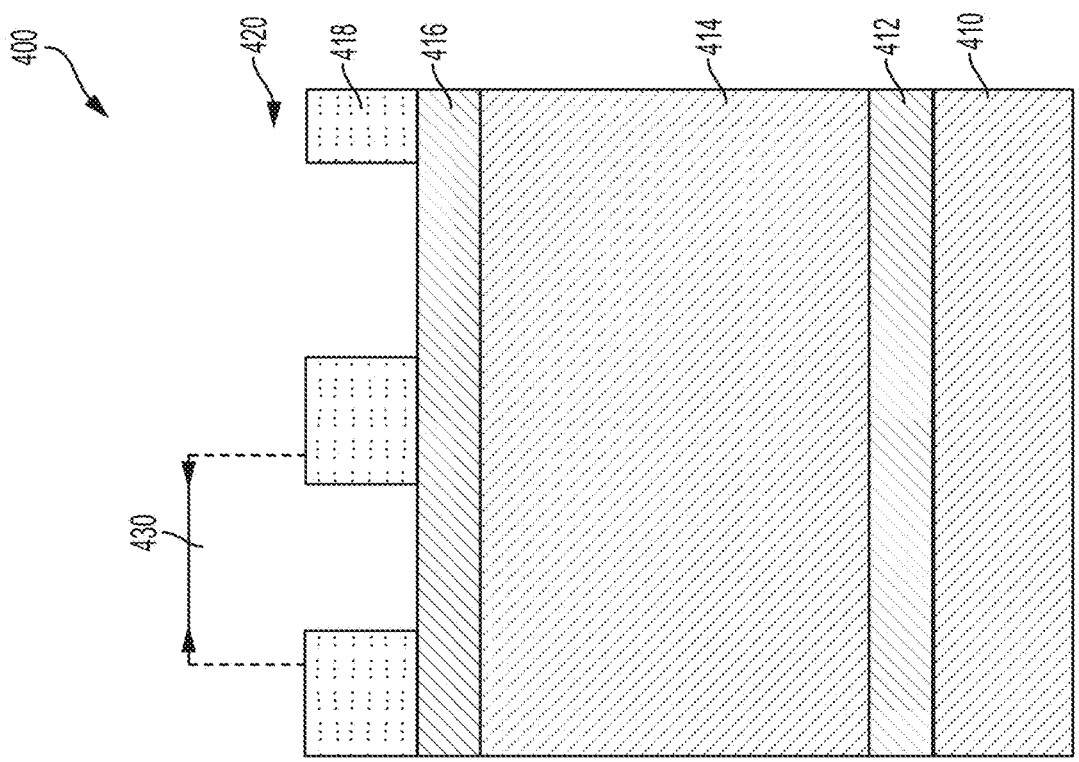

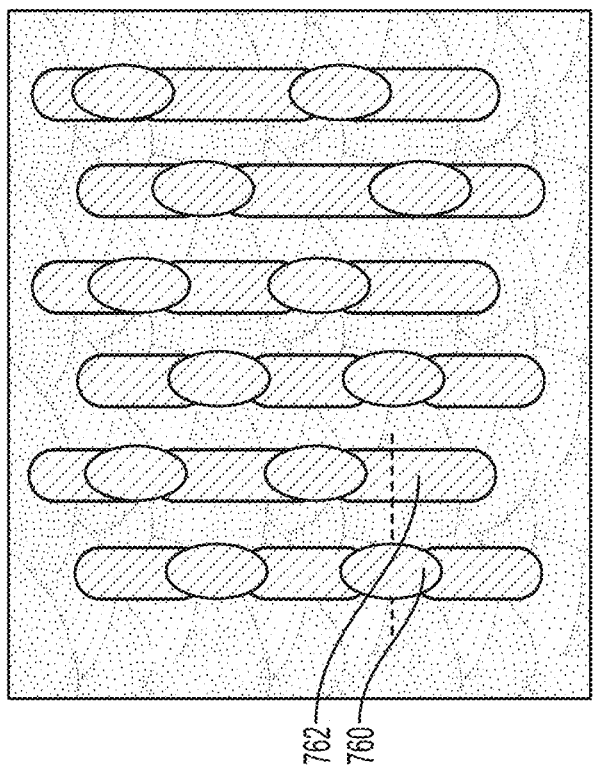
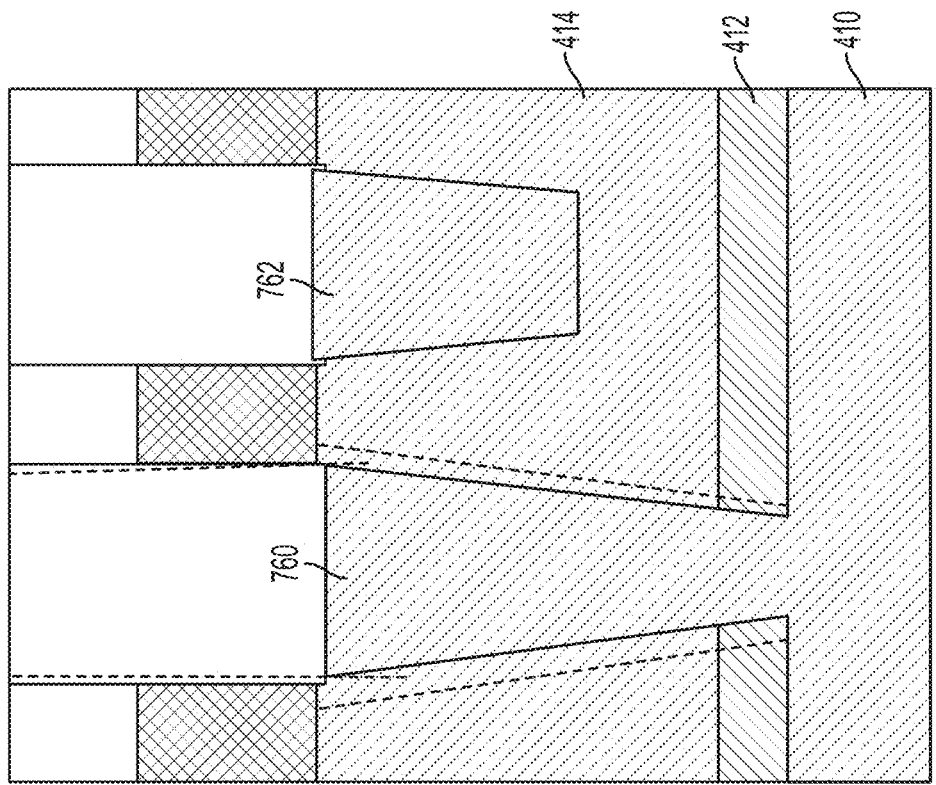
FIG. 7B
FIG. 7A

ENHANCED SELF-ALIGNMENT OF VIAS
FOR A SEMICONDUCTOR DEVICE

DOMESTIC PRIORITY

This application is a divisional application of U.S. patent application Ser. No. 15/198,962, titled "ENHANCED SELF-ALIGNMENT OF VIAS FOR A SEMICONDUCTOR DEVICE", filed Jun. 30, 2016, the contents of which are incorporated by reference herein in their entirety.

BACKGROUND

This document relates in general to integrated circuits and methods of fabrication. More specifically, this document relates to back end of line (BEOL) patterning.

Typical integrated circuits are formed by first fabricating individual semiconductor devices using processes referred to generally as the front end of line (FEOL). Thereafter, the individual devices on the integrated circuit are interconnected by forming the wiring of the wafer using processes referred to generally as the back end of line (BEOL). BEOL processes generally include the formation of contacts, insulating layers, metal layers, and bonding sites for chip-to-package connections.

A basic design construct of BEOL processes is the formation of a staggered configuration of vias or block mask structures, whereby the shapes are placed on a non-orthogonal array grid. Such structures can be challenging to image as feature sizes become smaller. In particular, the via is supposed to be constrained by the sidewalls of the line, which might not happen in the real-world applications.

SUMMARY

Described herein is a method of forming vias in a semiconductor. The method includes providing a semiconductor wafer in which front end of line (FEOL) processing has been completed. A dielectric mask is deposited over a metal layer. A hard mask is deposited over the dielectric layer. A lithographic pattern is formed over the hard mask. The lithographic pattern contains lines with notched areas. A via is etched in one of the one or more notched areas of the lithographic pattern.

Also described herein is an integrated circuit having a plurality of components formed in a FEOL process, metal lines coupling two or more components to each other, and one or more vias arranged to couple together two metal lines. The vias are formed by providing a semiconductor wafer in which FEOL processing has been completed. A dielectric mask is deposited over a metal layer. A hard mask is deposited over the dielectric layer. A lithographic pattern is formed over the hard mask. The lithographic pattern contains lines with notched areas. A via is etched in one of the one or more notched areas of the lithographic pattern.

Also described herein is a method of forming vias in a semiconductor. The method includes providing a semiconductor wafer in which FEOL processing has been completed. A dielectric mask is deposited over a metal layer. A hard mask is deposited over the dielectric layer. A lithographic pattern is formed over the hard mask. The lithographic pattern contains lines with notched areas. A via is etched such that the via is located adjacent to one of the one or more notched areas of the lithographic pattern.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIG. 4A shows a cross-section of an exemplary embodiment;

FIG. 4B shows an overhead view of an exemplary embodiment;

FIG. 7A shows the filling of vias and lines in a cross-section of an exemplary embodiment;

FIG. 7B shows the filling of vias and lines in an overhead view of an exemplary embodiment.

DETAILED DESCRIPTION

Figure 1B:
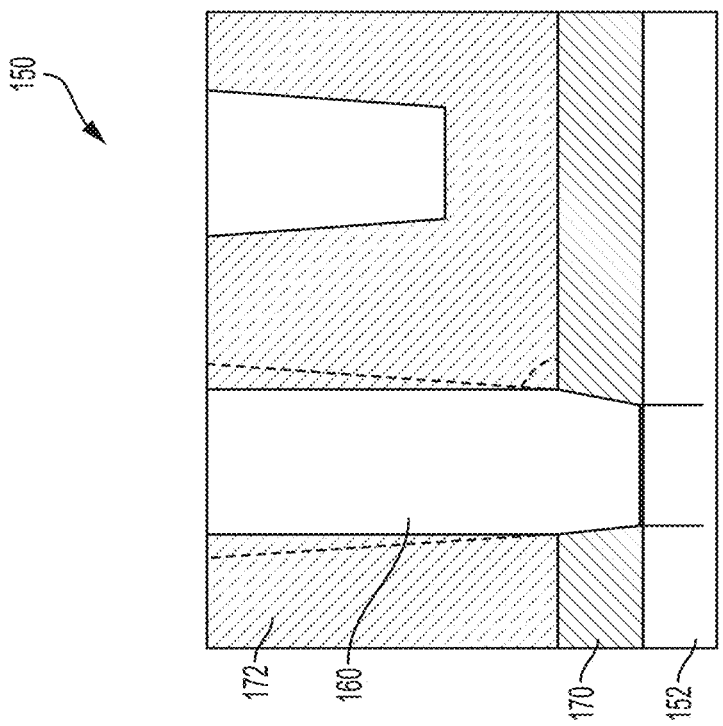
FIG. 1B shows a cross-section of an exemplary pattern of vias and lines for a semiconductor of the prior art.

It is understood in advance that although a detailed description of an exemplary process of back end of line (BEOL) patterning is presented herein, implementation of the teachings recited herein are not limited to any particular structure described herein. Rather, embodiments of the present invention are capable of being implemented in conjunction with any other type of integrated circuit fabrication processes, now known or later developed.

Various embodiments of the present invention are described herein with reference to the related drawings. Alternative embodiments may be devised. It is noted that various connections and positional relationships (e.g., over, below, adjacent, etc.) are set forth between elements in the following description and in the drawings. These connections and/or positional relationships, unless specified otherwise, may be direct or indirect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present invention will now be provided. Although specific fabrication operations used in implementing one or more embodiments of the present invention may be individually known, the described combination of operations and/or resulting structures are unique. Thus, the unique combination of the described operations utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Described herein is a novel design and structure for self-aligned pattern formation for semiconductor fabrication. As described above, a semiconductor might include multiple transistors, resistors, capacitors, and other components constructed during a FEOL process. Joining together multiple components are a metallization layer comprising a series of contacts, insulating layers, interconnect wires, bonding sites, and vias constructed during BEOL processing, wherein the vias are used to couple together metal lines that are on different levels. One basic design construct of BEOL processing is the use of vias or block mask structures along with metal lines. An exemplary pattern is shown in FIG. 1A. As shown in FIG. 1A, structure 100 includes lines 110 and 115 and vias 120 and 125. At larger feature sizes, there is no problem with vias. At smaller feature sizes there can be a "blow-out" region that reduces the amount of insulation between two metal lines. This is seen in FIG. 1A as the bulges on the side of via 120 and 125. Between line 110 and line 115 is a dielectric area. A bulge or blow-out causes the distance between line 110 and 115 to become smaller, which could possibly lead to short circuits or other types of defects. The defects might make a semiconductor device immediately unusable. Or the defects might reduce the operating life of the semiconductor device. A solution would be to reduce the diameter of the via. However, such a reduction might not be possible due to lithographic limitations and yield issues (too small of a via might reduce the yield of the manufacturing process).

Figure 1A:
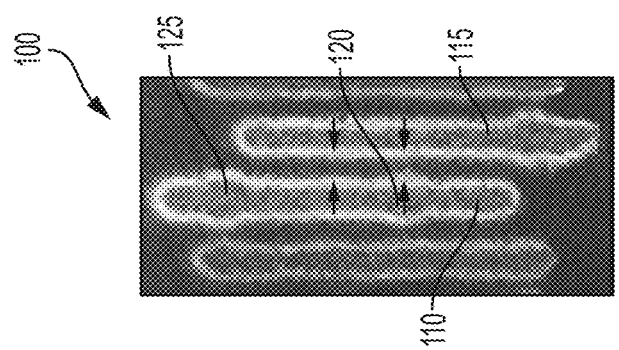
FIG. 1A depicts an exemplary pattern of vias and lines for a semiconductor of the prior art.

FIG. 1B shows a cross-section view of what is occurring at the vias. Structure 150 includes metal layer 152, via 160, and metal line 162, along with dielectric cap 170 and low-K dielectric 172. Ideally, a via 160 would have a cylindrical shape, such as via 160. However, process variations can result in a bulge (as will be seen in later figures).

Turning now to an overview of embodiments of the invention, one or more embodiments provide a methodology for reducing or eliminating blown out areas caused by the etching of vias and lines. Notches, or narrow areas of metal lines are created in the proximity of vias. In some embodiments, the notches can be created where the vias are located. In some embodiments, the notches can be created adjacent to where the vias are located.

Figure 2D:
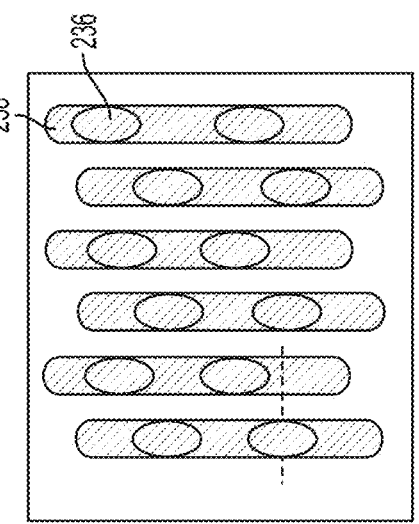
FIG. 2D shows the resulting combination of vias and lines of an exemplary embodiment.
Figure 2C:
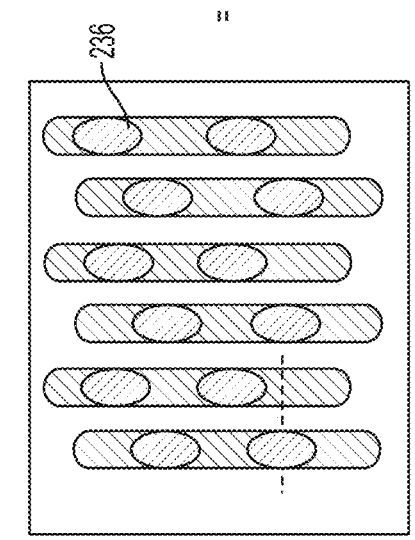
FIG. 2C shows the placement of vias relative to lines in an exemplary embodiment.
Figure 2A:
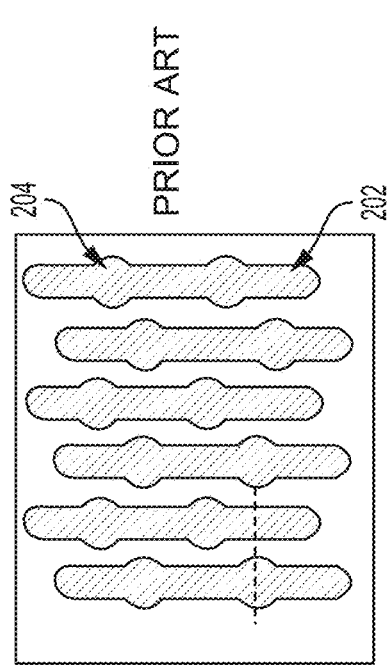
FIG. 2A illustrates a conventional structure of vias and lines.

Turning now to a more detailed description, in FIG. 2A, a conventional structure is shown for comparison purposes. In a similar manner as describe above, structure 200 includes lines 202 and vias 204. It can be seen that there is a potential "blow-out" region at each via 204. The result might be a line 202 that is too close to a via 204.

Figure 2B:
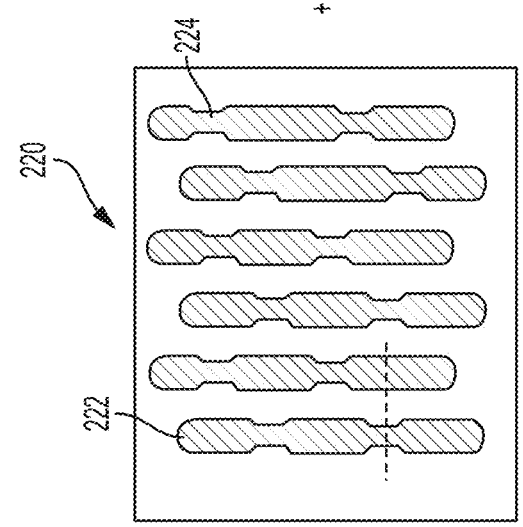
FIG. 2B shows lines of an exemplary embodiment.

In FIG. 2B, an embodiment is presented to alleviate the above-described problems. Structure 220 includes lines 222. However, each line 222 has a notch 224. As shown here, each line has two notches. It should be understood that there can be a different number of notches in each line. In FIG. 2C, vias 236 are added to each line 222 at a notch 224. The result, as shown in FIG. 2D, is lines 258 where there is no blow-out area—the vias 236 do not extend past line 258.

In an alternative embodiment, the above-referenced issues can be addressed through the use of the processes described herein. An overview of the technique is presented in FIGS. 3A through 3D.

Figure 3D:
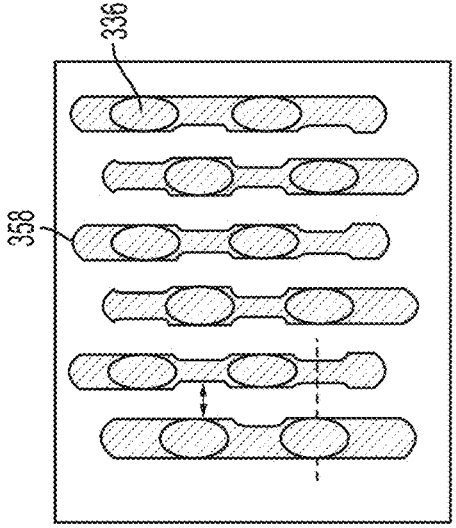
FIG. 3D shows the resulting combination of vias and lines of an exemplary embodiment.
Figure 3C:
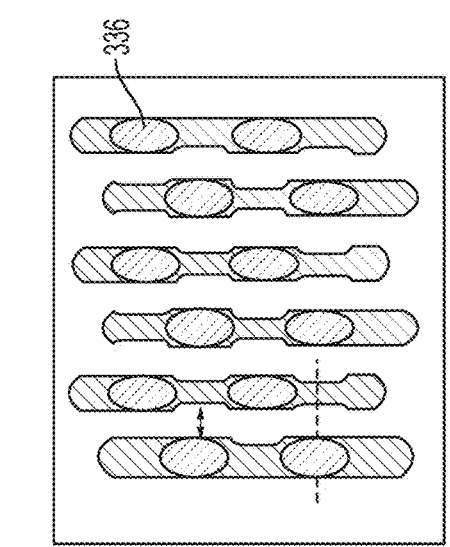
FIG. 3C shows the placement of vias relative to lines in an exemplary embodiment.
Figure 3A:
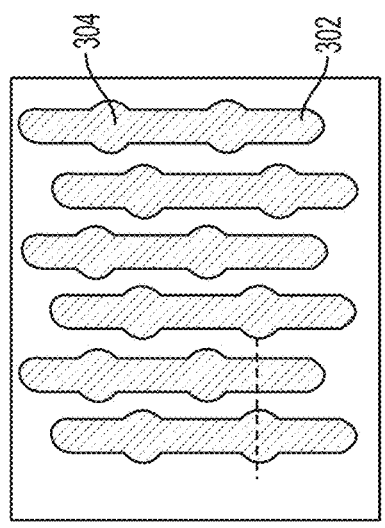
FIG. 3A illustrates a conventional structure of vias and lines.

In FIG. 3A, a conventional structure is shown for comparison purposes. In a similar manner as describe above, structure 300 includes lines 302 and vias 304. It can be seen that there is a potential "blow-out" region for each via, where a line 302 might be too close to a via 304.

Figure 3B:
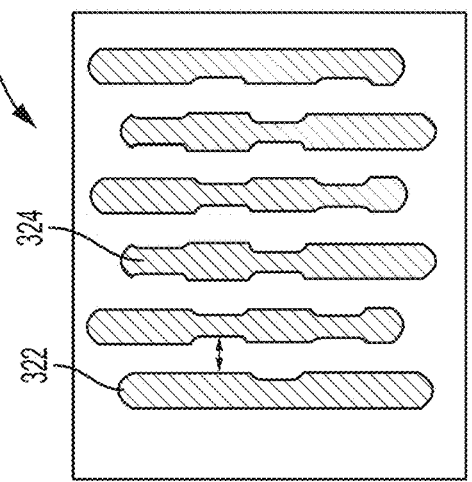
FIG. 3B shows lines of an exemplary embodiment.

In FIG. 3B, an embodiment is presented to alleviate the above-described problems. Structure 320 includes lines 322. However, each line 322 has a notch 324. As shown here, each line has two notches. It should be understood that there can be a different number of notches in each line. In FIG. 3C, vias 336 are added to each line 322 opposite a notch 324 on an adjacent line 322. The result, as shown in FIG. 3D, is lines 358 where there is no blow-out area. In other words, the vias 336 do not extend past line 358. While examples shown in FIGS. 2A through 3D illustrate a staggered pattern of vias, it should be understood that other configurations are also possible. The key difference between FIGS. 2B through 2D and FIGS. 3B through 3D is that in FIGS. 2B through 2D, the vias 236 are placed on a notch 224. In FIGS. 3B through 3D, the vias 336 are placed next to a notch 224 on an adjacent line.

Beginning in FIGS. 4A and 4B, an illustration of the steps involved is presented in an exemplary form. FIG. 4B presents a top-down view of a portion of a semiconductor wafer 400. FIG. 4A presents a cross-section taken at the dotted line 402. As seen in FIG. 4A, the semiconductor wafer has already received processing by this point. The FEOL processes have been completed and the BEOL processes have begun. It should be understood that there will be layers below the layers shown in FIGS. 4A and 4B, but they are not shown in the processing steps below.

There are several layers present in FIG. 4A, including a metal layer 410, a dielectric cap 412, an ultra-low K dielectric layer 414, an oxide hard mask 416, a hard mask of titanium nitride (TiN) 418, and a lithographic layer 420. These layers can be constructed of a variety of different materials, as is known in the art. For example, the oxide hard mask can be a titanium oxide. The ultra-low K material can be an organosilicate gas or a carbon doped silicon oxide. Other materials also can be used such as SiN, SiCN, SiO2, SiCON. The lines 430 and 432 that will be formed in the oxide hard mask layer 416 are formed in TiN hard mask 418 and lithographic layer 420. Other lines are also present in device 400. Each of these lines might have characteristics that are similar to that of lines 430 and 432. This is where the lines 430 and 432 will be placed in the ultra-low-K dielectric layer 414. As seen in both FIG. 4A and FIG. 4B, the gap is narrower in line 430 than line 432 at dotted line 402 because of the future placement of a via.

Figure 5B:
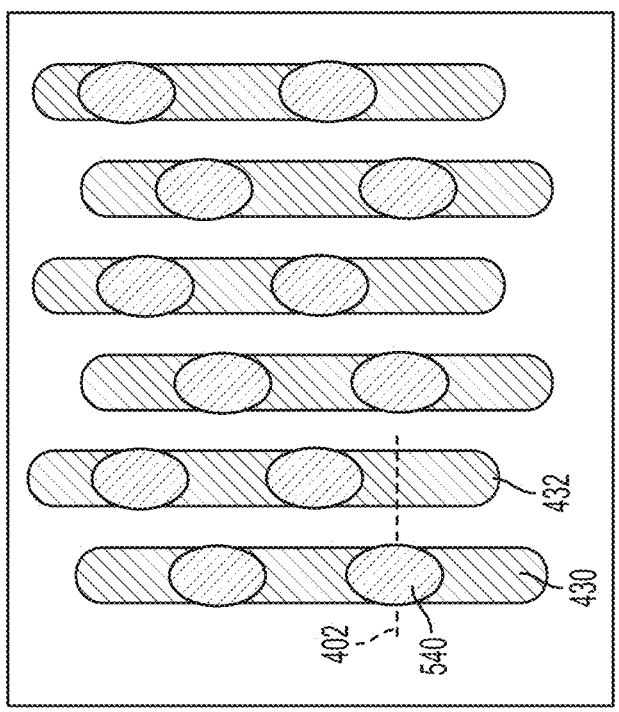
FIG. 5B shows the etching of vias in an overhead view of an exemplary embodiment.
Figure 5A:
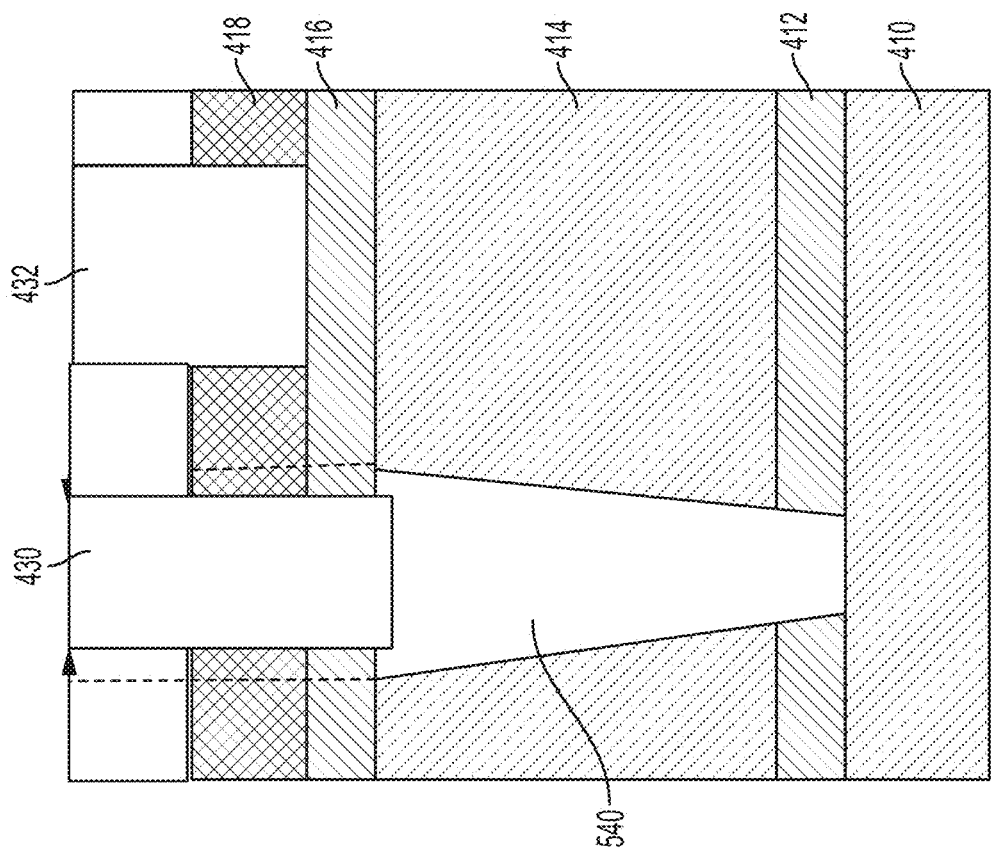
FIG. 5A shows the etching of vias in a cross-section of an exemplary embodiment.

Continuing with FIGS. 5A and 5B, a similar view as that presented in FIGS. 4A and 4B is presented, with further steps being performed. Here, an etch is performed through the oxide hard mask layer 416, ultra low-K layer 414, and dielectric cap 412 to form via 540, which exposes metal 410. Due to the characteristics of the etching process, the etch is tapered in a conical manner, such that the area being etched is smaller the closer to metal 410. If a blow-out area occurs (as shown, such a blow-out might occur at the junction of the oxide hard mask 416 and the ultra low-K dielectric layer 414), the blown out area is minimized due to the reduced width of line 430 where via 540 is being placed.

Figure 6B:
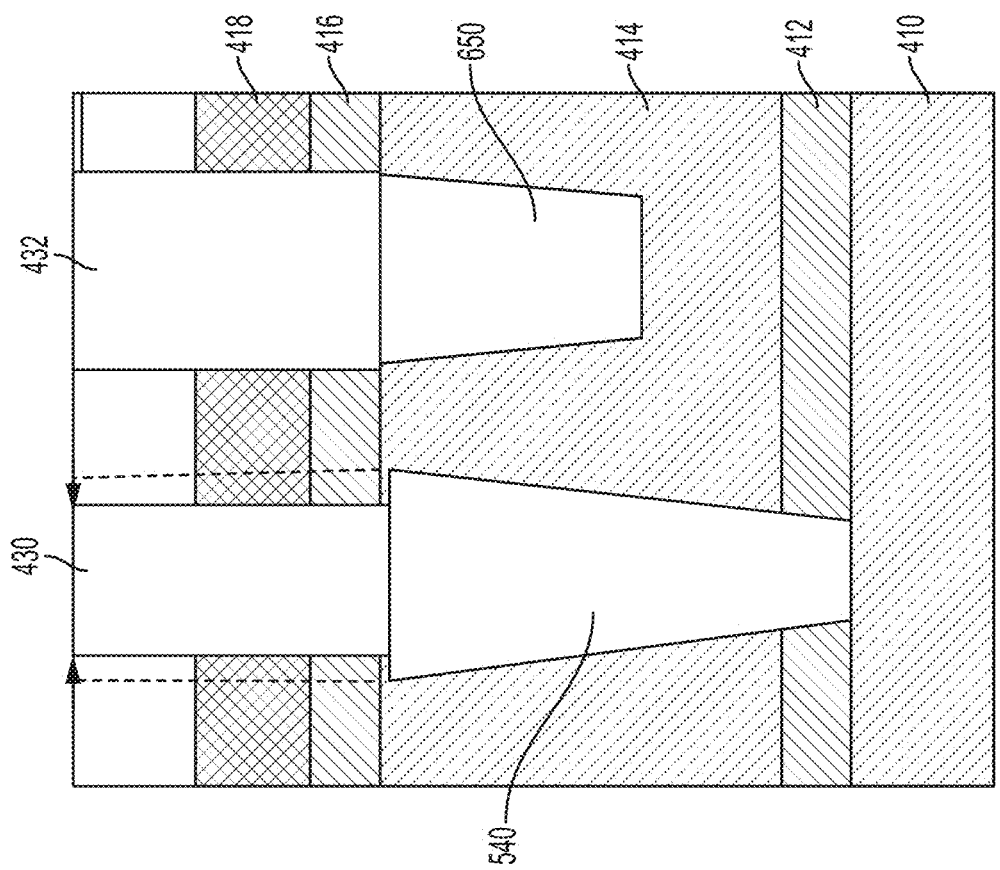
FIG. 6B shows the etching of lines in an overhead view of an exemplary embodiment.
Figure 6A:
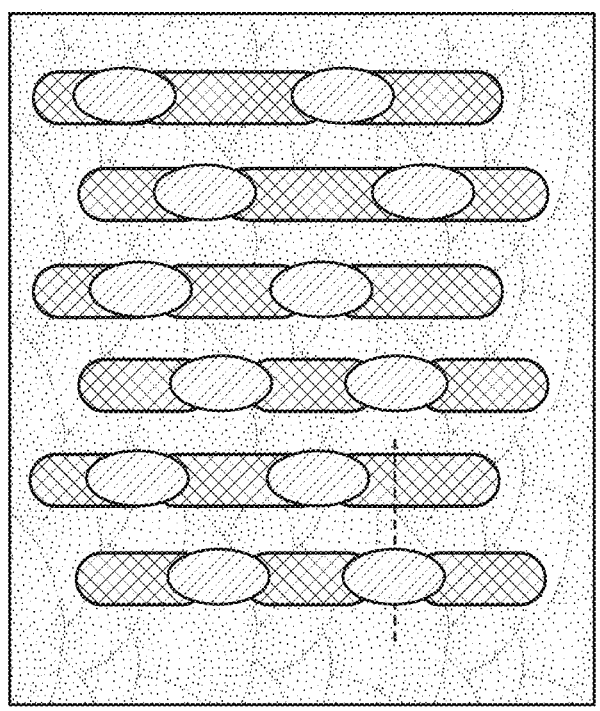
FIG. 6A shows the etching of lines in a cross-section of an exemplary embodiment.

Continuing with FIGS. 6A and 6B, a similar view as that presented in FIGS. 5A and 5B is presented, with further steps being performed. Here, line 432 is etched into the ultra low-K layer 414, resulting in patterned area 650, without exposing metal 410.

Continuing with FIGS. 7A and 7B, a similar view as that presented in FIGS. 6A and 6B is presented, with further steps being performed, via 540 and patterned area 650 are filled with a fill metal to result in metal via 760 and metal line 762. The fill metal can be any metal used in semiconductor fabrication. In some embodiments, the fill metal is copper. A planarization (such as a chemical-mechanical planarization (CMP)) is performed to remove hard mask 416 TiN mask 418.

Figure 8:
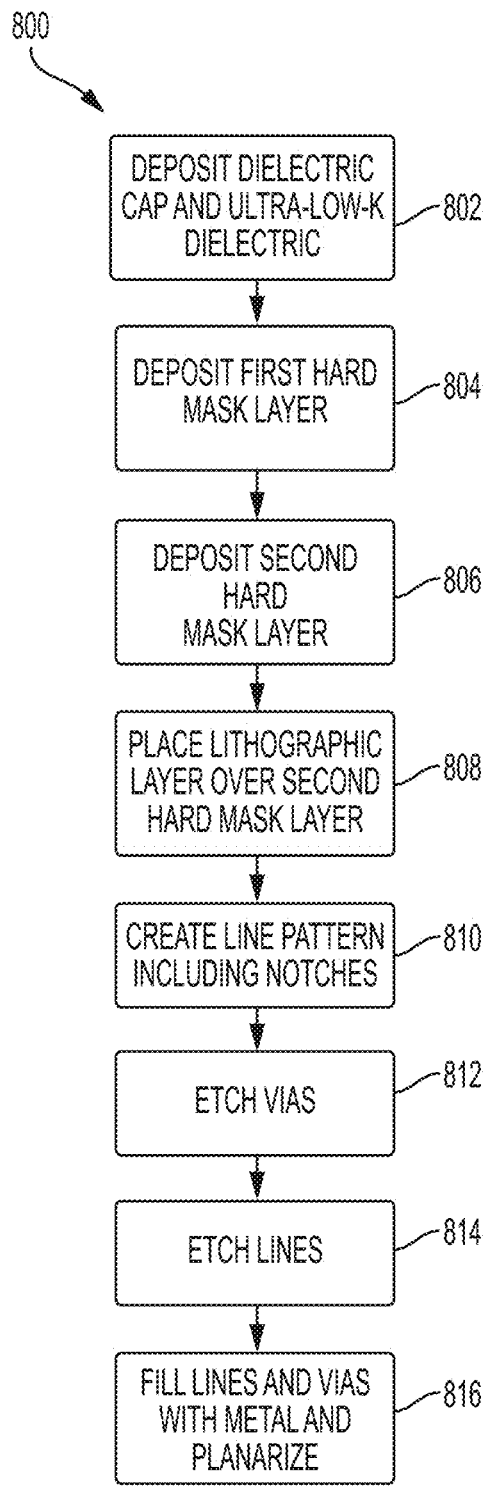
FIG. 8 is a flow diagram illustrating a methodology according to one or more embodiments.

FIG. 8 is a flow diagram illustrating a methodology 800 according to one or more embodiments. Method 800 is merely exemplary and is not limited to the embodiments presented herein. Method 800 can be employed in many different embodiments or examples not specifically depicted or described herein. In some embodiments, the procedures, processes, and/or activities of method 800 can be performed in the order presented. In other embodiments, the procedures, processes, and/or activities of method 800 can be performed in any other suitable order. In still other embodiments, one or more of the procedures, processes, and/or activities of method 800 can be combined or skipped.

Method 800 begins with providing a semiconductor wafer in which the FEOL processes have been completed and the BEOL has begun with the depositing of a metal layer. After a dielectric cap and an ultra-low-K dielectric is deposited (block 802), a first hard mask layer is deposited (block 804). The first hard mask can be one of a variety of different materials, such as a titanium oxide or other type of oxide. A second hard mask layer is deposited (block 806). This second hard mask layer can be a nitride, such as titanium nitride (TiN). A lithographic layer is placed over the hard mask layer (block 808) and a pattern for lines is created (block 810). This pattern for lines includes some areas that are not as wide as other areas called notches.

The vias are then etched (block 812). This can be accomplished by one of a variety of different methods. The vias are placed where the notches are. In such a manner, if a blown-out area is formed occurs, the blown out area is approximately the same width as a non-notched line. The etch is through the first hard mask layer, the ultra-low-k dielectric layer, and the dielectric cap layer to reveal the underlying metal layer.

The lines are then etched, using one of a variety of different techniques (block 814). In some embodiments, the lines are etched as deep as the ultra-low-k dielectric layer without exposing the metal layer. Thereafter, the etched areas are filled with a metal and a planarization is performed (block 816). The planarization removes the second hard mask layer and the first hard mask layer and levels the metal with the ultra-low-k dielectric layer. Any type of metal can be used as the fill. In some embodiments, copper is used as the metal fill. Thereafter, traditional BEOL processes can be performed, including the creation of additional metal layers, lines, and vias, using the techniques as described above or more traditional methods.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. An integrated circuit comprising:
    metal lines formed to have one or more notched areas, wherein the metal lines comprise adjacent metal lines; and
    metal vias formed in the one or more notched areas such that the metal vias in the adjacent metal lines are offset from one another, a portion of one of the metal vias being bounded in a lateral direction by a first part of a dielectric layer and a second part of the dielectric layer;
    wherein a metal layer is under and in direct contact with the one of the metal vias such that an entire bottom part of the portion in the lateral direction of the one of the metal vias bounded between the first part of the dielectric layer and the second part of the dielectric layer is directly formed on a top surface of the metal layer.

2. The integrated circuit of claim 1, wherein the one or more notched areas are smaller than the metal lines.

3. The integrated circuit of claim 1, wherein the one or more notched areas have a reduced size in the metal lines.

4. The integrated circuit of claim 1, wherein the dielectric layer separates the metal lines from the metal layer underneath.

5. The integrated circuit of claim 1, wherein material of the metal lines next to one of the metal vias does not contact the metal layer under the metal lines, and the material is on an opposite side of the dielectric layer from the one of the metal vias.

6. The integrated circuit of claim 1, wherein no intervening layer is between the portion of the one of the metal vias and the metal layer underneath.

\* \* \* \* \*